(12) United States Patent
Levante et al.

(10) Patent No.: US 8,499,442 B2
(45) Date of Patent: *Aug. 6, 2013

(54) PROCESS FOR FABRICATING A CONNECTOR

(76) Inventors: James J Levante, Emerald Hills, CA (US); Dennis Johnson, Ripon, CA (US); Tom Sahakian, San Jose, CA (US)

( * ) Notice: Subject to any disclaimer, the term of this patent is extended or adjusted under 35 U.S.C. 154(b) by 977 days.

This patent is subject to a terminal disclaimer.

(21) Appl. No.: 12/584,629

(22) Filed: Sep. 8, 2009

(65) Prior Publication Data

US 2010/0024211 A1 Feb. 4, 2010

Related U.S. Application Data

(62) Division of application No. 11/803,979, filed on May 15, 2007, now Pat. No. 7,666,008.

(51) Int. Cl.
*H01R 9/00* (2006.01)

(52) U.S. Cl.
USPC .......... 29/842; 29/846; 29/874; 29/884; 439/66

(58) Field of Classification Search
USPC .......... 29/825, 842, 846, 874, 884; 439/66
See application file for complete search history.

(56) References Cited

U.S. PATENT DOCUMENTS

| | | | | |
|---|---|---|---|---|
| 7,666,008 B2 * | 2/2010 | Levante et al. | ................ | 439/91 |
| 8,225,500 B2 * | 7/2012 | Levante et al. | ................ | 29/842 |
| 2010/0018054 A1 * | 1/2010 | Levante et al. | ................ | 29/882 |
| 2010/0024211 A1 * | 2/2010 | Levante et al. | ................ | 29/845 |

* cited by examiner

*Primary Examiner* — Carl Arbes
(74) *Attorney, Agent, or Firm* — Ronald C. Fish

(57) ABSTRACT

A conductive elastomeric and mechanical pin and contact system for creation of a Elastromechanical Connector (1) that combines Mechanical Pins, an Insulator Array with Conductive Elastomeric Memory Material. This combination provides a low cost, high density, reliable, reusable electronic interconnect system. This system can be used in place of most connector systems in use today. It replaces any connector that uses pins and sockets and also supports the fine conductor pitch required in the semiconductor business like Ball Grid Array (BGA) Sockets and related devises. The inventive device includes mechanical pins (2), installed in an insulator (3), each mechanical pin is topped with conductive elastomeric compound (4). A mechanical pin is used for each connection point, the insulator positions the mechanical pins in an array pattern appropriate to the interconnection requirement. A conductive elastomeric compound is added to each metal pin to create the Z axis electrical coplanality to the mating unit. This connector will mate between printed circuit boards, packaged electronic assembles, BGAs or LGA type products, harnesses or cables without the need of solder or pins and sockets. Eliminating solder or pins and sockets reduces the pitch between connections. Mechanical pins are plated drawn, formed or machined conductive metal alloys. Insulator is molded or machined out of engineered plastic examples being, but not limited to, FR-4, Ultem®, Polyimide, Torlon®. Electrically conductive elastomeric compounds made up of flexible silicone and rubbers with conductive compounds added.

1 Claim, 11 Drawing Sheets

THROUGH HOLE

THROUGH HOLE

SOLDER BALL MOUNT

SOLDER BALL MOUNT

SURFACE MOUNT

SURFACE MOUNT

COMPRESSION MOUNT

COMPRESSION MOUNT

THROUGH HOLE

THROUGH HOLE

SOLDER BALL MOUNT

SOLDER BALL MOUNT

SURFACE MOUNT

SURFACE MOUNT

COMPRESSION MOUNT

COMPRESSION MOUNT

THROUGH HOLE

THROUGH HOLE

SOLDER BALL MOUNT

SOLDER BALL MOUNT

SURFACE MOUNT

SURFACE MOUNT

COMPRESSION MOUNT

COMPRESSION MOUNT

CONE

POINT

BUMP

CYLINDER

RING

DOT

THROUGH HOLE

SOLDER BALL MOUNT

SURFACE MOUNT

COMPRESSION MOUNT

THROUGH HOLE

SOLDER BALL MOUNT

SURFACE MOUNT

COMPRESSION MOUNT

PARTICLES SUSPENDED IN SILICONE UNDER COMPRESSION ARE SQUEEZED AGAINST THE "V" SHAPED WALL WHICH TRANSMITS CURRENT DOWN PLATED THRU HOLE OR PIN. IT DOES NOT RELY ON Z AXIS COMPRESSION OF THE PARTICLES ONLY.

KAPTON CARRIER WITH FLOATING PIN AND
ELASTOMERIC BUMPS

PROCESS FOR FABRICATING A CONNECTOR

This is a divisional application under 1.53(b) of prior U.S. patent application Ser. No. 11/803,979, filed May 15, 2007 now U.S. Pat. No. 7,666,008 priority to which is claimed under the provisions of 35 USC 120 and 37 CFR 1.78.

BACKGROUND OF THE INVENTION

Field of the Invention

The present embodiments relates generally to improvements in prior art "pogo pin" coplanarity connectors for removable attachment of high value integrated circuits to printed circuit boards. Hereafter, these pogo pin connectors will be called coplanarity connectors. More specifically the embodiments disclosed herein relate to a conductive elastomeric and mechanical pin and contact system for creation of a Elastromechanical Connector. The various disclosed embodiments have one or more of the following features: low cost, high density, reliability, reusability. The embodiments can be used in place of most connector systems in use today. The embodiments can be used to replace almost any connector that uses pins and sockets and also supports the fine conductor pitch required in the semiconductor business like Ball Grid Array (BGA) Sockets and related devices.

BRIEF DESCRIPTION OF THE DRAWINGS

FIGS. 14A, 14B and 14 C illustrate various views of a thin film embodiment with "squashed balls" for pins which is shown in FIG. 13. FIG. 14A is a perspective view of the polymide insulating substrate 3 showing the array of "squashed balls" at the test points. FIG. 14B is an edge view and FIG. 14C is an edge view from just about the plane of the substrate.

DETAILED DESCRIPTION OF THE VARIOUS EMBODIMENT

Figure 1:
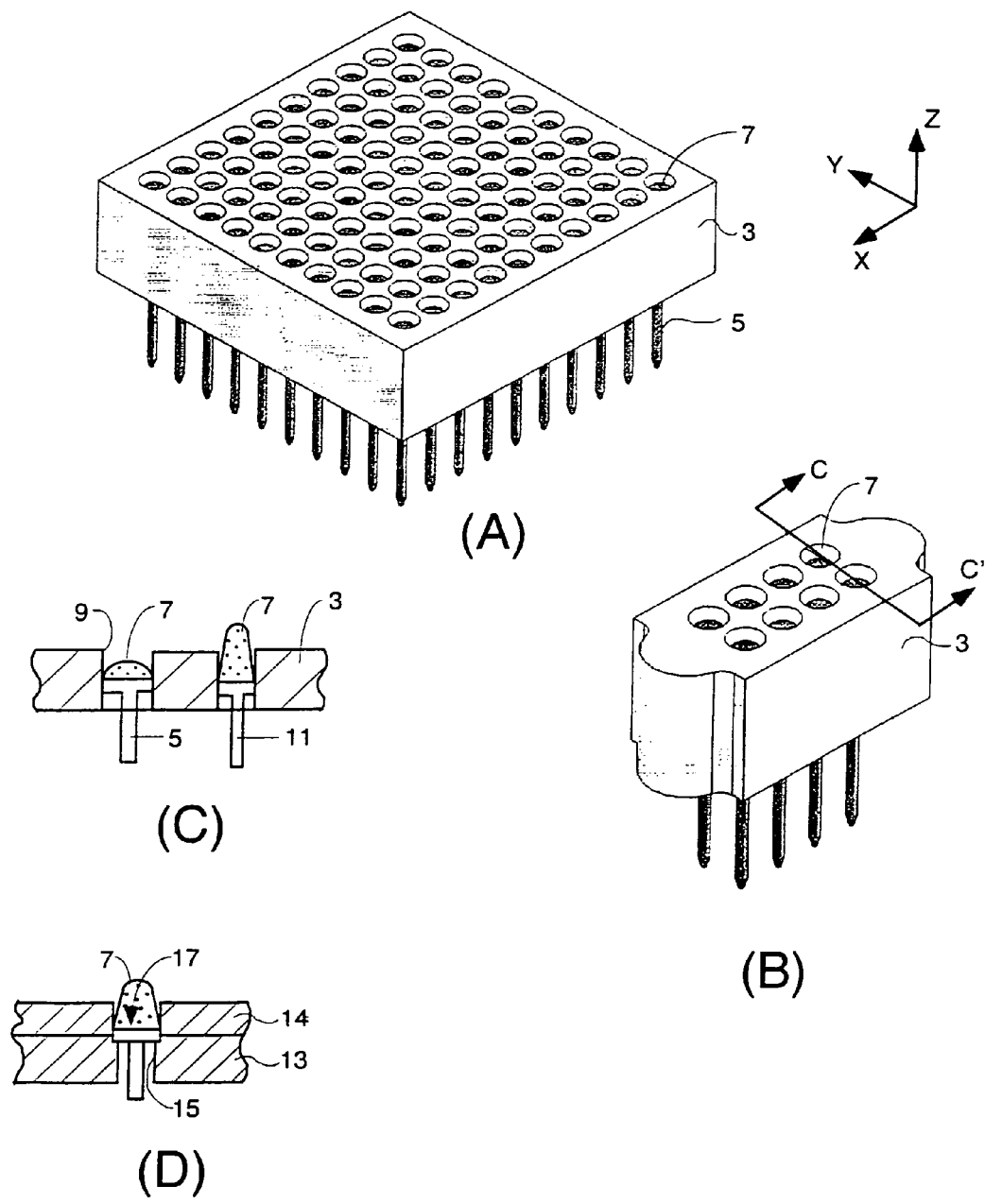
FIG. 1A and FIG. 1B are views of Elastromechanical Connectors having an insulator board 3 having holes formed therein with connector pins 5 projecting from the bottom, and conductive, elastomeric polymer 7 which has been injected into the holes and cured.
FIG. 1C is a cross-sectional view of the two pin taken along section line C-C'. The pin 5 on the left has flex dot 7 injected into hole 9 with lust enough volume of polymer to provide a flex dot which bulges above the top surface of pin enough to provide a flexible, conductive contact for a ball grid array. The pin 11 on the right has a flex dot 7 which has been injected with enough volume of conductive polymer to cause the flex dot to protrude above the top surface of the insulator board 3 so as to enable connection to a LAN pad in a LAN array. In an alternative embodiment shown in FIG. 1D, the pins can be placed flush in a first half 13 of an insulator which has a hole 15 which has a smaller diameter than the diameter of the top of the pin or which has an inset for the pin top 17 so that the pin fits flush with the top of the hole 15. Then a second half insulator board 14 with a hole diameter which is the same as or less than the diameter of the pin top 17 can be mated with the first half board 13 and bonded to it or otherwise fastened to the board 13 by screws, side clips, tongue in groove, studs and holes press fit together, fusion of a meltable substance on the mating surface of one or both of the boards, contact cement, epoxy, or any other fastening arrangement which holds the two boards together.
Figure 2:
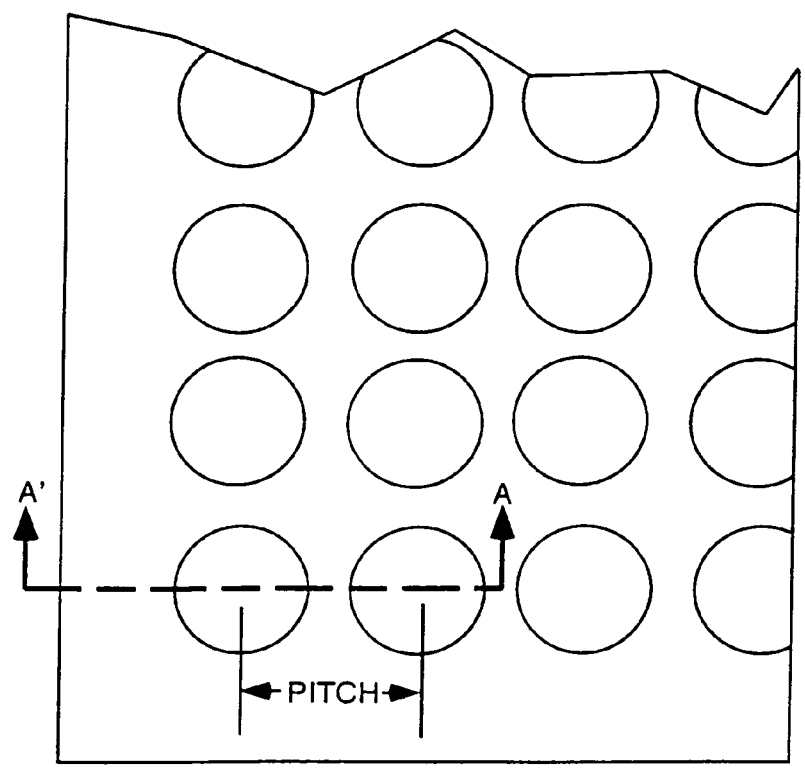
FIG. 2 is Close up of BGA style Elastromechanical Connector.

Manufacturers of microprocessors and other high value chips who do not want to solder these chips into boards want pitch of 0.5 millimeters which is difficult for prior art pogo pins to reach and which would make pogo pins of this pitch capability even more expensive to make. FIGS. 1(A) through 1(D) illustrate the basic concepts utilized in the various embodiments. FIG. 2 illustrates the pitch of the pins according to the various embodiments. This pitch can be made smaller than in the prior art because the pins and holes can be made smaller since mechanical springs required in pogo pins are no longer used to create electrical coplanarity. Section line A-A' is the section illustrated in FIGS. 3-10. FIGS. 3-10 illustrate numerous different embodiments for the pins and the conductive, elastomeric compound polymer of the flex dots The attached FIGS. 1-13 illustrate various embodiments or species within the genus of the invention. FIG. 1A and FIG. 1B are views of Elastromechanical Connectors having an insulator board 3 having holes formed therein with connector pins 5 projecting from the bottom. Each hole has a conductive, elastomeric polymer 7 (hereafter referred to as the "flex dot") injected therein which has been cured. The flex dot should have enough durometer to apply a sufficient amount of force to get a good "wipe", i.e., make a good electrical contact with a ball grid array or LAN connection pad which may have contaminants or oxidation on its surface. Generally a good wipe requires the same force as is applied by the prior art pogo pins but the flex dots in the embodiments herein just have to apply enough force at each pin location to make good electrical contact and that can be more or less than the prior art pogo pins.

FIG. 1C is a cross-sectional view of the two pin taken along section line C-C'. The pin 5 on the left has flex dot 7 injected into hole 9 with just enough volume of polymer to provide a flex dot which bulges above the top surface of pin enough to provide a flexible, conductive contact for a ball grid array. The pin 11 on the right has a flex dot 7 which has been injected with enough volume of conductive polymer to cause the flex dot to protrude above the top surface of the insulator board 3 so as to enable connection to a LAN pad in a LAN array. An actual connector would have flex dots all of the same volume so FIG. 1C is for illustration of the different types of flex dots that mate with ball grid arrays versus LAN pad arrays.

In some embodiments, the dots inside the flex dots represent any conductive substance such as metal flakes, carbon, etc. In other embodiments, these dots inside the polymer flex dots represent conductive particles coupled with abrasive particles which are either conductive or none conductive. Examples are: silver or gold partials alone, conductive silver partials and conductive plated diamond partials, silver or gold partials coupled with diamond or glass or boron or carbide chips, conductive silver partials and conductive plated carbide partials, conductive silver partials and conductive plated glass partials, boron plated in silver and silver or gold flakes mixed in with any other abrasive particle in the silicone. The flexible polymer host for these abrasive chips is typically silicone but it can be any flexible material that is conductive or can be rendered conductive by addition of other materials and which cures to a hardness sufficient to both provide coplanarity as well as sufficient durometer for a good wipe.

The purpose of the abrasive particles such as diamond chips, conductive plated diamond partials, conductive plated glass partials, and conductive plated carbide partials is to provide some abrasive particles that improve the wipe by penetrating any oxide or other contamination on the surface of the mating ball grid array, LAN pad array or other conductive surface. One embodiment uses partials of about 15 micron size. Some embodiments use Zoflex FL-75E liquid conductive rubber for the flex dots, and other embodiments use SS-26 (without diamond particle abrasives embedded therein but having silver particles embedded therein to enhance conductivity) or SS-26S-152 (which has conductive diamond and silver particles embedded therein, the diamond particles to improve the wipe and the silver to improve the conductivity) from Silicone Solutions of Twinsburg, Ohio, but any material which meets the above stated functional criteria will suffice.

The pins 5 can be hand placed in the holes, press fit in by a stitching machine, inserted by a robotic machine which includes a shaker table to shake pins from a hopper into the holes and then individually punches each pin further into its hold for a press fit. In an alternative embodiment shown in FIG. 1D, the pins can be placed flush in a first half 13 of an insulator which has a hole 15 which has a smaller diameter than the diameter of the top of the pin or which has an inset for the pin top 17 so that the pin fits flush with the top of the hole 15. Then a second half insulator board 14 with a hole diameter which is the same as or less than the diameter of the pin top 17 can be mated with the first half board 13 and bonded to it or otherwise fastened to the board 13 by screws, side clips, tongue in groove, studs and holes press fit together, fusion of a meltable substance on the mating surface of one or both of the boards, contact cement, epoxy, or any other fastening arrangement which holds the two boards together.

Generally, the genus in which all the embodiments reside is a conductive elastomeric material (flex dot) placed in a hole in a substrate which is one of one or more substrates with a metal "pin" placed in a hole in one of the one or more substrates so as to be in electrical contact with the flex dot. The pin provides sufficient mechanical support so that the flex dot material can be compressed in the final installation and provides an electrically conductive path through the hole in the substrate. The pin must be retained in the hole, but the retainer mechanism can be anything that functions to keep the pin in the hole. The flex dot material provides z axis flexibility to account for non planar arrays of LANs or solder balls with which the connector must mate and make reliable contact with at each LAN or solder ball location. The flex dot material has electrically conductive particles embedded therein in some embodiments (or is natively conductive without embedded particles). In embodiments where the flex dot material is natively conductive, and has conductive particles embedded therein, the flex dot material must be compressed sufficiently in the final installation to cause the conductive particles to come into contact with each other and provide electrically conductive paths therethrough. The flex dot material is placed in the holes by any method. For example, the flex dot material can be injected into each hole by an automated machine or it can be manually injected. It can also be placed in the holes by a stencil and wipe process (place a stencil on the substrate after the pins are installed with holes co-located at the pins, wipe the flex dot material on the stencil to fill the holes and remove the stencil. The holes in the substrate can drilled, otherwise machined or molded in the insulating substrate. The insulating substrate can be flexible or rigid. The flex dot material makes electrical connection to the pin at least one end of the pin. The pin does not have to have a metal probe or pin portion extending beyond the surface of the insulating substrate. It can be just a metal plug in the hole with a metal surface that is flush with one or more surface of the insulating substrate and which has elastomeric material in electrical contact with one or more surfaces of the pin. The pins can be in the form of metal balls or in the form of metal plated through holes in a PCB with V shaped "sockets" at both ends of the through hole which are also metal plated. The V shaped socket provides mechanical support for the flex dot material, and the metal plating provides the electrical conductivity through the hole in the PCB, as illustrated in FIG. 12.

Retention mechanisms to keep the pins in the hole can be any of the following or anything else which keeps the pin in the hole: 1) press fit; 2) pins are balls with diameter which is initially smaller than the diameter of the hole but which gets larger so as to form a press fit which the balls are squashed; 3) pin has a head which sits in an inset at the top of the hole in the bottom substrate (FIG. 1C) with a mating substrate with a mating hole which is smaller in diameter than the diameter of the head of the pin with flex dot material put in the hole in the second substrate so as to be in electrical contact with the head of the pin; 4) the pin has a diameter which is smaller than the diameter of the hole and has extensions which stick out from the top and bottom surfaces of the substrate with the flex dot material placed on the extensions so as to provide z axis flexibility and "glue" the pin in the hole on each end to trap it; 5) glue; 6) barbs on the side of the pins which engage the walls of the holes in the insulating substrate so that once pushed into a hole, the barbs engage it is very difficult to get the pins out.

Figure 13:
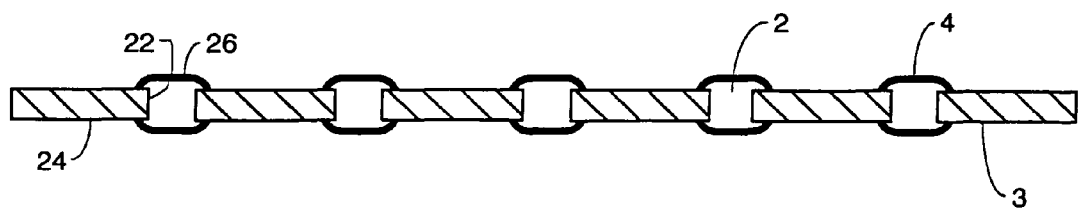
FIG. 13 illustrates an embodiment where the pins take the form of metal balls which have been squashed after having been placed in the holes.

In one embodiment, illustrated in FIG. 13, the pins are metal balls 2 (solder, copper or brass for example) with a diameter which is slightly smaller than the diameter 22 of the holes in the substrate 3. The substrate 3 is a flexible film made of Kapton™ polyimide film. To make this structure, holes are drilled or punched or otherwise formed in the film. The balls are placed into the holes on the substrate by pouring them onto the surface and rubbing them till they fall into holes. Kapton tape is used on one surface to block exit of the balls from the opposite surface of the substrate. The excess balls that did not find a hole are removed, typically with an air blast. Then the structure is put into a press and sufficient force (6000 psi has been found to be sufficient but other force levels can be used depending upon the malleability of the balls) is applied to the surface of the substrate so as to cause the balls to "bloom", i.e., the balls are squashed so that they expand latterly such that their diameter is increased to cause a press fit in the holes. The balls are bigger in diameter than the thickness of the substrate, so after they are squashed, part of each ball projects from each surface of the film. The tape is then removed and the flex dot material 4 is applied to one or both surfaces of each ball. The flex dot material is applied to both surfaces of each ball by any method. One method is to place a stencil on the surface with a hole co-located with the position of each ball. The flex dot material is then wiped onto the surface of the stencil and the stencil is removed and the flex dot material is cured.

FIGS. 3*a*-3*d*, 4*a*-4*d*, 5*a*-5*d*, 6*a*-6*d*, 7*a*-7*d*, 8*a*-8*d*, 9*a*-9*f*, 10*a*-10*d*, 11*a*-11*d*, 12 and 13 all show various embodiments of the contact system, which include mechanical pins (2), installed in an insulator (3), each mechanical pin being electrically coupled to a conductive elastomeric compound (4), on one or both ends, which takes the place of the spring in the prior art pogo pin connector. A mechanical pin is used for each connection point or hole in the insulating substrate to provide mechanical support and an electrically conductive path through the hole in the substrate. The insulator 3 has holes therein which position the mechanical pins in an array pattern appropriate to the interconnection requirement. A conductive elastomeric compound is injected or placed in any way in each hold to make electrical contact with each metal pin to create Z axis flexibility so that the pin can move up or down as needed according to the unevenness of the surface of the array of connector pads to which the pins connect. This creates electrical coplanality to the mating unit so that all pins make a good, solid electrical connection to their mating pads. This connector will mate between printed circuit boards, packaged electronic assembles, BGAs or Lan Grid Array (LGA) type products, harnesses or cables without the need of solder or pins and sockets. Eliminating solder or pins and sockets reduces the pitch between connections.

The features of the various embodiments illustrated in the figures are as follows.

Figure 3A:
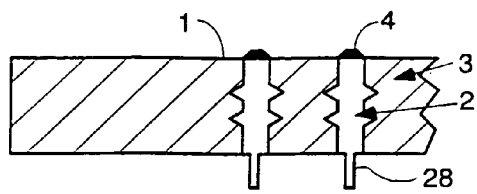
FIG. 3 is Section AA Elastromeric above Insulator.

FIG. 3A illustrates a through hole pin with a portion 28 which extends past the surface of the substrate 3 and which is placed in through holes on a customer's printed circuit board (PCB). The flex dot 36 is positioned on the top of the pin to make contact with the LAN or BGA.

Figure 4A:
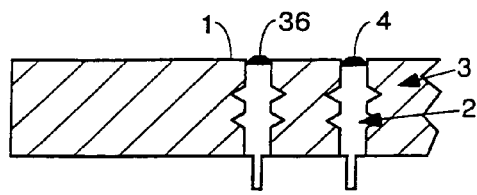
FIG. 4 is Section AA Elastromeric below Insulator.

FIG. 4A is the same of FIG. 3A but the flex dot 36 and pin 2 are below the surface of the substrate 3.

Figure 5A:
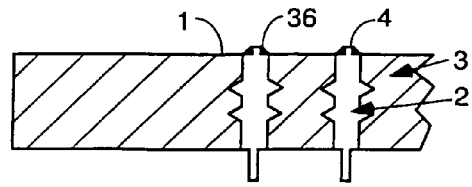
FIG. 5 is Section AA Elastromeric above Insulator with extended Mechanical Pin.

FIG. 5A is the same of FIG. 3A but a portion of the metal pin 2 extending up into the center of the flex dot to act as re-bar.

Figure 6A:
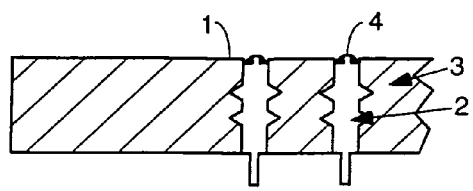
FIG. 6 is Section AA Elastromeric below Insulator with extended Mechanical Pin.

FIG. 6A is the same of FIG. 5A but the flex dot 36 and pin 2 are below the surface of the substrate 3.

Figure 7A:
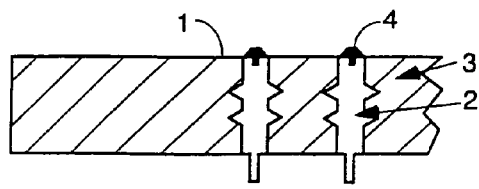
FIG. 7 is Section AA Elastromeric above Insulator with recessed Mechanical Pin.

FIG. 7A is the same of FIG. 3A but the center portion of the metal pin 2 is cut out to make a pocket for the flex dot 36 to form into.

Figure 8A:
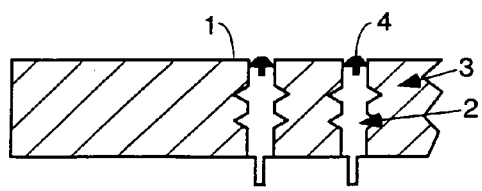
FIG. 8 is Section AA Elastromeric below Insulator with recessed Mechanical Pin.

FIG. 8A is the same of FIG. 7A but the flex dot 36 and pin 2 are below the surface of the substrate 3.

Figure 3B:
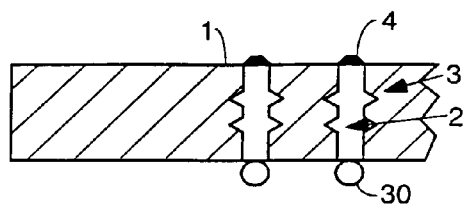

FIG. 3B illustrates a pin that uses solder balls to surface mount to the customer's printed circuit board (PCB). The flex dot 36 is positioned on the top of the pin to make contact with the LAN or BGA.

Figure 4B:
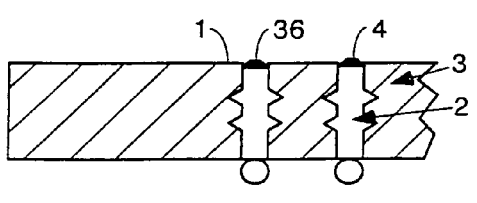

FIG. 4B is the same of FIG. 3B but the flex dot 36 and pin 2 are below the surface of the substrate 3.

Figure 5B:
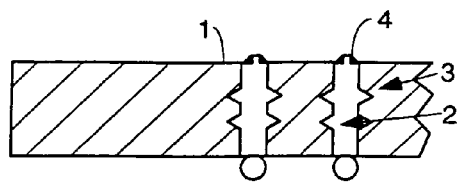

FIG. 5B is the same of FIG. 3B but a portion of the metal pin 2 extending up into the center of the flex dot to act as re-bar.

Figure 6B:
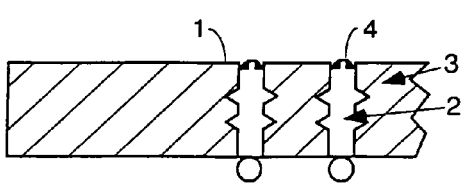

FIG. 6B is the same of FIG. 5B but the flex dot 36 and pin 2 are below the surface of the substrate 3.

Figure 7B:
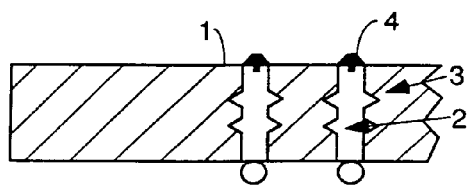

FIG. 7B is the same of FIG. 3B but the center portion of the metal pin 2 is cut out to make a pocket for the flex dot 36 to form into.

Figure 8B:
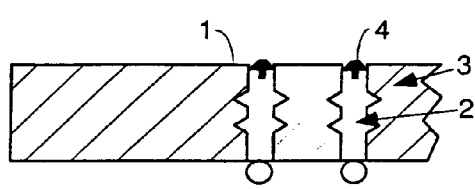

FIG. 8B is the same of FIG. 7B but the flex dot 36 and pin 2 are below the surface of the substrate 3.

Figure 3C:
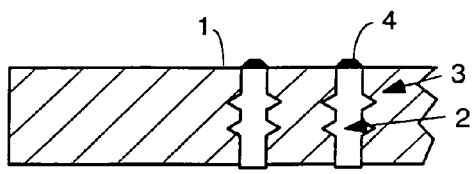

FIG. 3C illustrates a pin that uses solder paste to surface mount to the customer's printed circuit board (PCB). The flex dot 36 is positioned on the top of the pin to make contact with the LAN or BGA.

Figure 4C:
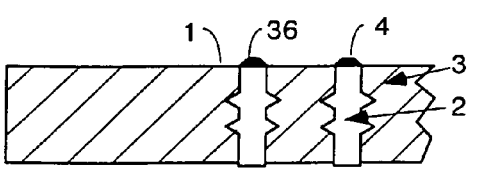

FIG. 4C is the same of FIG. 3C but the flex dot 36 and pin 2 are below the surface of the substrate 3.

Figure 5C:
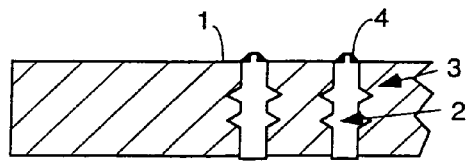

FIG. 5C is the same of FIG. 3C but a portion of the metal pin 2 extending up into the center of the flex dot to act as re-bar.

Figure 6C:
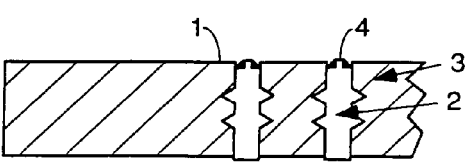

FIG. 6C is the same of FIG. 5C but the flex dot 36 and pin 2 are below the surface of the substrate 3.

Figure 7C:
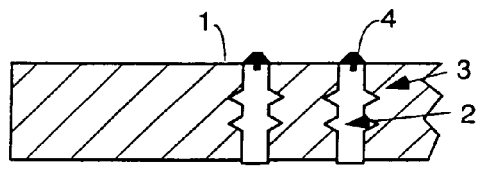

FIG. 7C is the same of FIG. 3C but the center portion of the metal pin 2 is cut out to make a pocket for the flex dot 36 to form into.

Figure 8C:
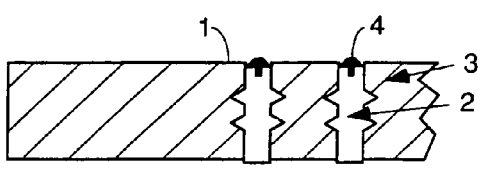

FIG. 8C is the same of FIG. 7C but the flex dot 36 and pin 2 are below the surface of the substrate 3.

Figure 3D:
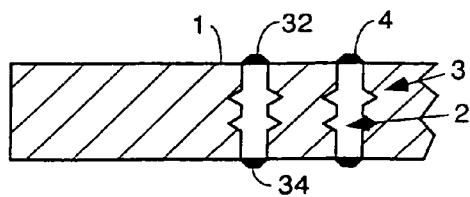

FIG. 3D illustrates a pin that uses a flex dot 36 on both the top and bottom of the pin 2 to create a compression mount between customer's printed circuit board (PCB) and a LAN or BGA.

Figure 4D:
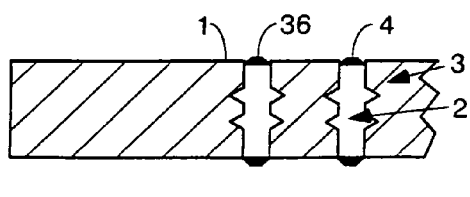

FIG. 4D is the same of FIG. 3D but the flex dots 36 and pin 2 are below the surface of the substrate 3.

Figure 5D:
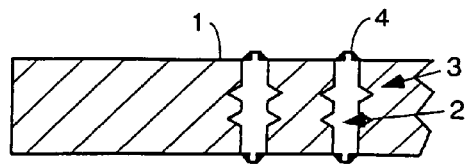

FIG. 5D is the same of FIG. 3D but a portion of the metal pin 2 extending up into the center of the flex dots to act as re-bar.

Figure 6D:
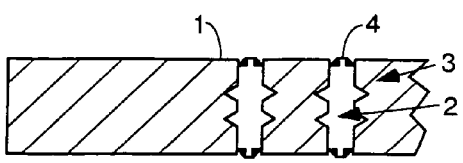

FIG. 6D is the same of FIG. 5D but the flex dots 36 and pin 2 are below the surfaces of the substrate 3.

Figure 7D:
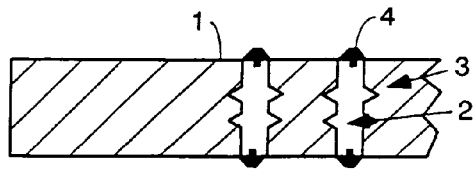

FIG. 7D is the same of FIG. 3D but the center portion of the metal pin 2 is cut out to make a pocket for the flex dots 36 to form into.

Figure 8D:
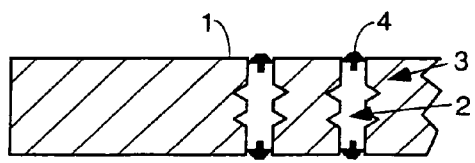

FIG. 8D is the same of FIG. 7D but the flex dots 36 and pin 2 are below the surface of the substrate 3.

Figure 9A:
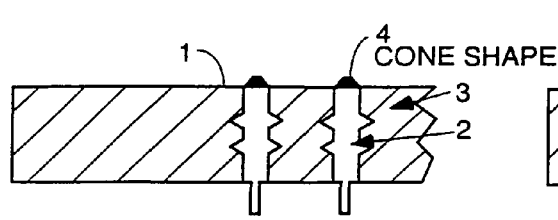
FIG. 9 is Views of Elastomeric Configurations.

FIG. 9A depicts a cone shaped flex dot 36 that can be installed on the pin 2 using a dispensing machine to dispense conductive polymer or a silk-screening process.

Figure 9B:
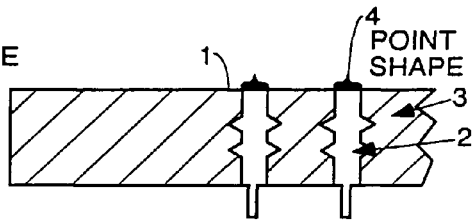

FIG. 9B is the same of FIG. 9A but depicts a point shaped flex dot 36.

Figure 9C:
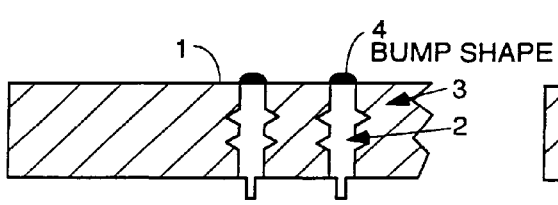

FIG. 9C is the same of FIG. 9A but depicts a bump flex dot 36.

Figure 9D:
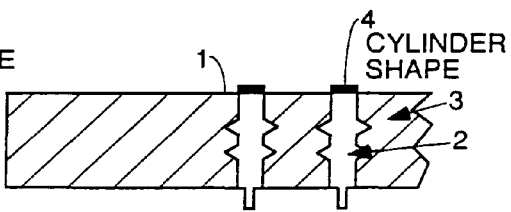

FIG. 9D is the same of FIG. 9A but depicts a cylinder shaped flex dot 36.

Figure 9E:
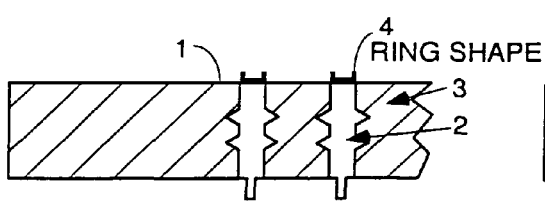

FIG. 9E is the same of FIG. 9A but depicts a ring shaped flex dot 36.

Figure 9F:
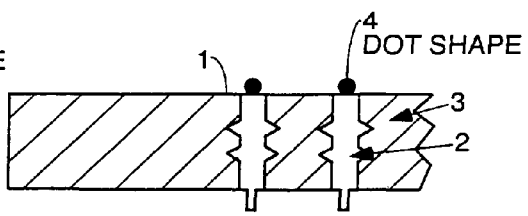

FIG. 9F is the same of FIG. 9A but depicts a dot shaped flex dot 36.

Figure 10A:
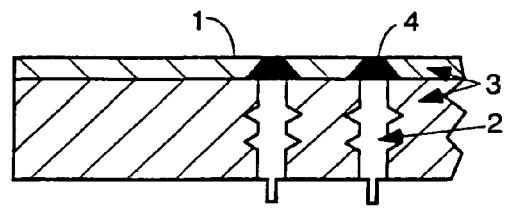
FIG. 10 illustrates an embodiment with two insulating substrates where the flex dot material is applied in one substrate and the pin is placed in a co-located hole in the second substrate

FIG. 10A illustrates an embodiment with two insulating substrates where the flex dot material is applied in one substrate and the pin is placed in a co-located hole in the second substrate in a through hole configuration with a portion of the pin 28 that extends past the surface of the substrate 3 and which is placed in through holes on a customer's printed circuit board (PCB).

Figure 10B:
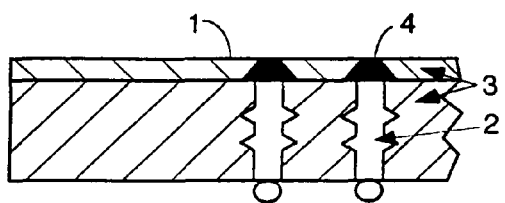

FIG. 10B is the same of FIG. 10A but uses solder balls to surface mount to the customer's printed circuit board (PCB).

Figure 10C:
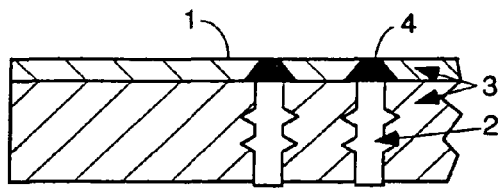

FIG. 10C is the same of FIG. 10A but uses solder paste to surface mount to the customer's printed circuit board (PCB).

Figure 10D:
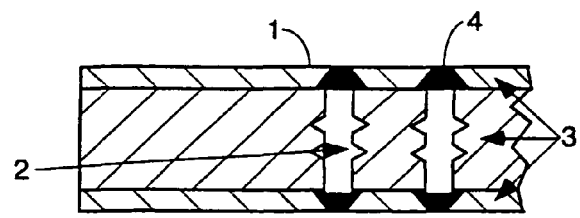

FIG. 10D illustrates an embodiment with three insulating substrates where the flex dot material is applied in a top and bottom substrate and the pin is placed in a co-located hole in the center substrate. The stack up of three substrates creates compression mount between customer's printed circuit board (PCB) and a LAN or BGA.

Figure 11A:
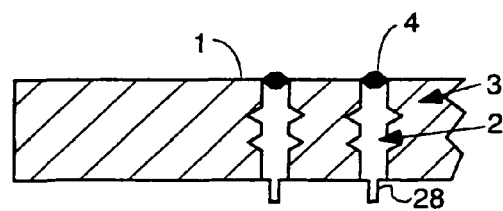
FIGS. 11(A) through 11(D) illustrate a collection of embodiments where diamond shaped flex dots are used.

FIG. 11A illustrates a through hole pin with a portion 28 which extends past the surface of the substrate 3 and which is placed in through holes on a customer's printed circuit board (PCB). Pin 2 has a chalice shape feature that provides support for the flex dot 36 which is positioned on the top of the pin to make contact with the LAN or BGA.

Figure 11B:
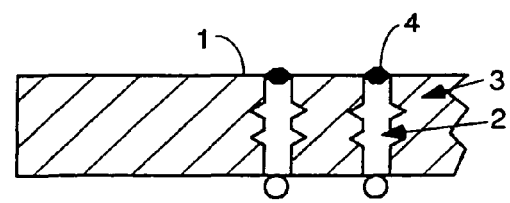

FIG. 11B is the same of FIG. 11A but uses solder balls to surface mount to the customer's printed circuit board (PCB).

Figure 11C:
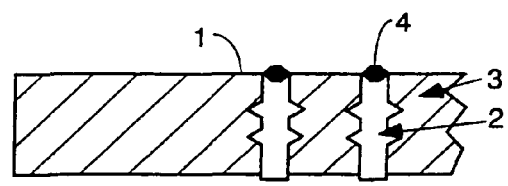

FIG. 11C is the same of FIG. 11A but uses solder paste to surface mount to the customer's printed circuit board (PCB).

Figure 11D:
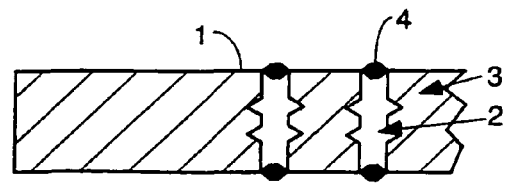

FIG. 11D is the same of FIG. 11A but uses a flex dot 36 on both the top and bottom of the pin 2 to create a compression mount between customer's printed circuit board (PCB) and a LAN or BGA.

FIG. 12 illustrates an embodiment where no pin is used and a metal plated through hole is substituted. The metal plated through hole has metal plated "sockets" on each end which serves the mechanical support function. The metal plating serves the function of the pin to provide electrical conductivity through the hole. It uses a flex dot 36 on both the top and bottom of the pin 2 to create a compression mount between customer's printed circuit board (PCB) and a LAN or BGA.

FIG. 13 illustrates an embodiment where metal balls are formed (squashed) into pins in the substrate. It uses a flex dot 36 on both the top and bottom of the pin 2 to create a compression mount between customer's printed circuit board (PCB) and a LAN or BGA.

Figure 14:
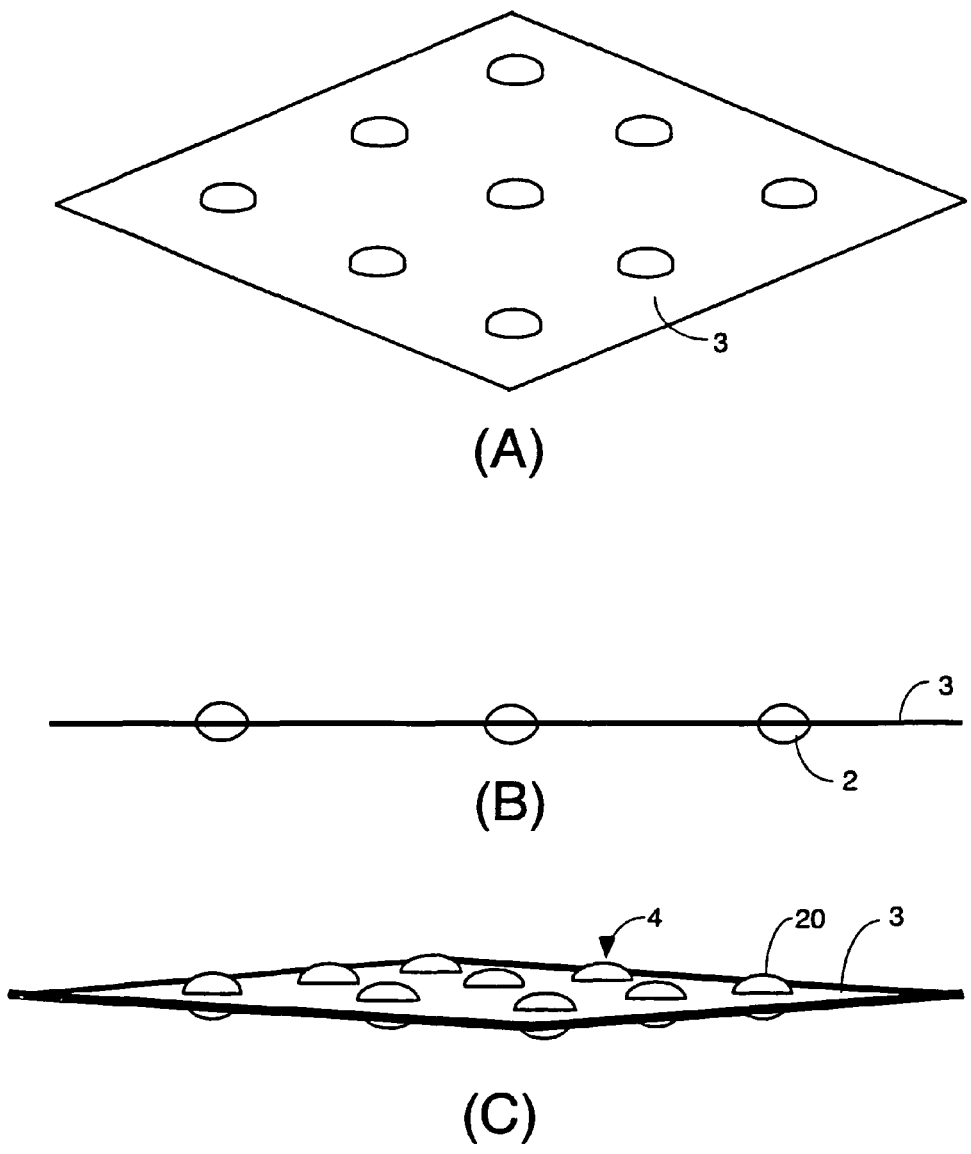

FIGS. 14A, 14B and 14C illustrate various views of a thin film embodiment with "squashed balls" for pins which is shown in FIG. 13. FIG. 14A is a perspective view of the polymide insulating substrate 3 showing the array of "squashed balls" at the test points. FIG. 14B is an edge view and FIG. 14C is an edge view from just about the plane of the substrate.

In some of the embodiments, the mechanical pins 2 are plated drawn, formed or machined conductive metal alloys. Insulator 3 is molded or machined out of engineered plastic examples being, but not limited to, FR-4, Ultem®, Polyimide, Torlon®. Electrically conductive elastomeric compounds 4 are made up of flexible silicone and rubbers with conductive compounds added. In one embodiment, the elastomeric compounds 4 have diamond chips, glass, carbide, boron plated in silver and silver/gold mixed in with the silicone to provide abrasive elements which dig into any oxidation covering the mating pad.

Mechanical pins are, for example, but not limited to, copper alloys, brass, beryllium copper, phosphor bronze. The mechanical pin will have a plated surface for example, but not limited to, nickel, gold, silver, palladium, tin. Mechanical pins are designed to carry current and frequency for specific designs additionally pins are designed for industry standard mounting, through hole, solder ball mount, surface mount, and compression mount applications.

Insulator is molded or machined out of engineered plastic examples being, but not limited to, FR-4, Ultem®, Polyimide, Torlon®. Molded or machined engineered plastic, glass, or ceramic material used to position, retain and insulate the mechanical pins and conductive elastomeric compounds. The insulator positions the mechanical pins in an array pattern appropriate to the interconnection requirement. The insulator is designed to retain different size pins to meet various electrical requirements. The insulator positions, retains and insulates the mechanical pins and conductive elastomeric compounds. Insulators are also designed to support pins for industry standard mounting through hole, solder ball mount, surface mount and compression mount applications.

Electrically conductive elastomeric compounds made up of flexible silicone and rubbers with conductive compounds added. Electrically conductive elastomeric compounds made up of flexible silicone and rubbers with conductive compounds added. The material has Z axis memory to provide electrical coplanality to the mating unit. Elastomeric structures that are applied to mechanical pins are shaped to make optimal contact to mating contact, for examples, but not limited to, bump, cone, ring pointed cone and cylinder.

Mechanical pins (2), are installed in an insulator (3), each mechanical pin is topped with conductive elastomeric compound (4). A mechanical pin is used for each connection point, the insulator positions the mechanical pins in an array pattern appropriate to the interconnection requirement. A conductive elastomeric compound is added to each metal pin to create the Z axis electrical coplanality to the mating unit. This connector will mate between printed circuit boards, packaged electronic assembles, BGAs or LGA type products, harnesses or cables without the need of solder or pins and sockets. Eliminating solder or pins and sockets reduces the pitch between connections. The low cost and highly customizable aspect of the elastromechanical connector makes it an ideal connector used in consumer items like cell phones and PDAs. The elastromeric qualities of the mechanical connection makes the connector rugged making it suitable for toys, outdoor products and military applications. The near permanent memory of the elastomeric combined with the fine pitch and accuracy of the mechanical pin makes the product suitable for the IC test/BGA test market. The low cost, sealing qualities and high current carrying capability makes this connector an excellent choice for disposable medical applications.

The Elastromechanical Connector (1) installs to a circuit in place of any standard parallel board to board co-planar connector. Connections to the circuit are made through the Mechanical Pins (2) using standard soldering methods in practice today. The Insulator (3) positions the mechanical pins in an array that meets the required interconnection footprint. The Conductive Elastomeric (4) compound is applied to the Mechanical Pins and finished to provide a elastic conductive contact for the mating circuit. The mating circuit can take the form of printed circuit boards, packaged electronic assembles, BGAs or LGA type products, harnesses or cables.

Figure 12A:
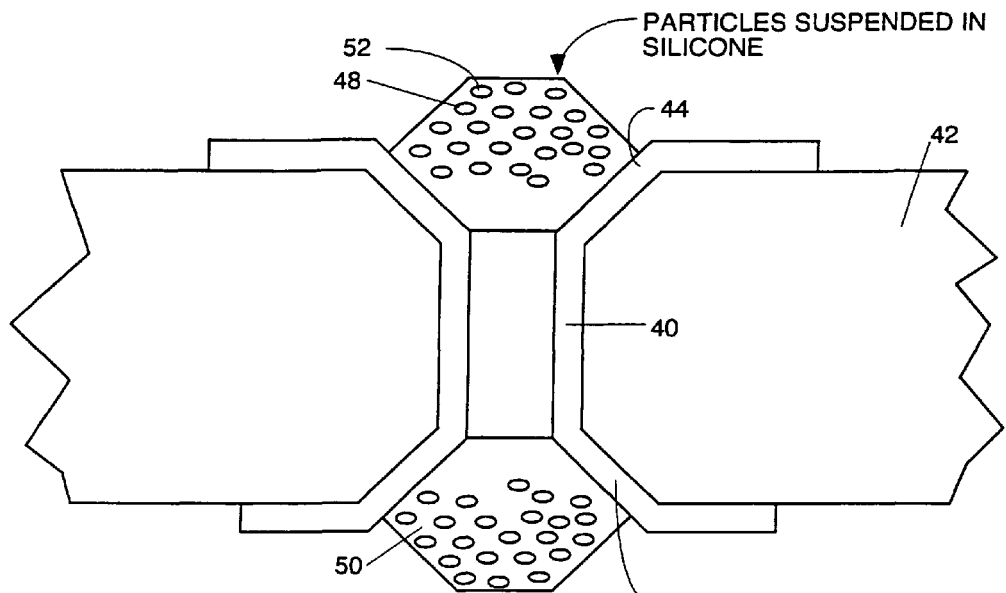
FIG. 12 illustrates an embodiment where no pin is used and a metal plated through hole is substituted. The metal plated through hole has metal plated "sockets" on each end which serves the mechanical support function. The metal plating serves the function of the pin to provide electrical conductivity through the hole.
Figure 12B:
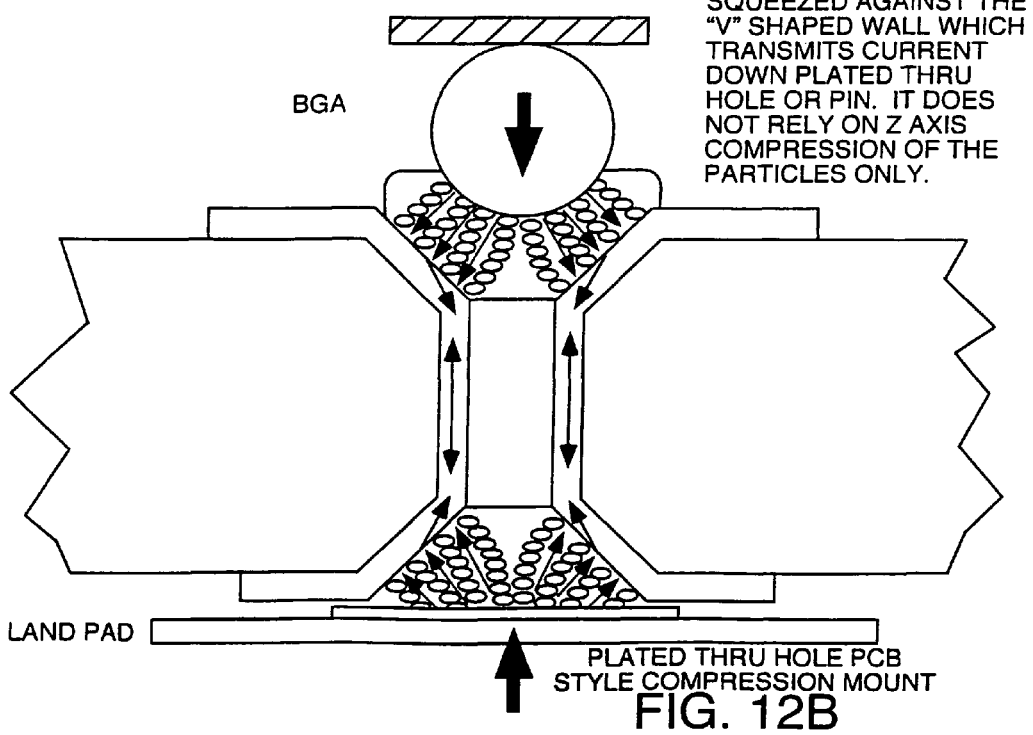

FIG. 12(A) illustrates an embodiment where no pin is used and a metal plated through hole 40 in the insulating substrate 42 is substituted. The metal plated through hole has V-shaped (conical) metal plated "sockets" 44 and 46 on each end which serves the mechanical support function. The metal plating serves the function of the pin to provide electrical conductivity through the hole. The flex dot material 48 and 50 is applied in any way and has conductive particles 52 embedded therein. In some embodiments, these particles are plated abrasive particles such as metal plated diamond chips as well as metal particles such as shards of silver or aluminum. The abrasive particles improve the ability of the flex dot material to cut through any oxide or other foreign materials which hinder electrical contact. The conductive particles come into contact with each as illustrated in FIG. 12(B) when the connector is installed and the flex dot material is compressed. This provides a plurality of electrical paths through the flexible material to the metal plating 44 of the V-shaped socket. This embodiment has the feature that no pin is used and standard PCB process is used to provide a mechanism that is equivalent to the pin in doing both function of the pin, i.e., mechanical support to allow the flex dot material to be compressed and provision of an electrically conductive path through the insulating substrate 42 of the connector.

Generically, the class of processes for making any of the connectors described herein is comprised of the steps:

forming holes in an insulating substrate;

retaining conductive pins in each hole where the pins might just be metal plated through holes in a printed circuit board with conically shaped sockets on each end of the through hole; and placing electrically conductive flexible material in each hole in contact with said pins.

One embodiment of a process to make connectors of the type described herein is comprised of the steps:

a) designing an insulating substrate using a customer specification;

b) programming a CNC machine to form holes in an insulating substrate according to the design formed in step a;

c) programming a dispensing machine to dispense conductive polymer into each of the holes of the substrate;

d) using the CNC machine to make the holes in said substrate;

e) placing a pin in each hole;

f) using an automated dispensing machine to dispense electrically conductive polymer in each hole;

g) curing said polymer.

Another process to make connectors of the embodiment of FIG. 13 is comprised of the steps:

forming holes in a polyimide film substrate, typically by drilling;

placing a metal ball in each hole with the ball having a diameter which is smaller than said hole and using any temporary means on one surface of said substrate to prevent said balls from dropping out of said holes;

placing pressure on each ball so as to deform it such that its diameter increases sufficiently to form a press fit with the walls of said hole such that each said ball is retained in its hole when said temporary means is removed; and placing a stencil over said film substrate with holes in said stencil co-located with holes in said substrate;

wiping a conductive, flexible polymer onto said stencil so as to fill said holes in said stencil and come into physical and electrical contact with the tops of said balls; and removing said stencil and allowing said polymer to cure.

In the claims, the term "insulating substrate" means one or more insulating substrates. If two substrates are used, they have mating holes which do not have to be of the same diameter. The substrate can be very thin and flexible such as a polyimide film, or it can be rigid like a FR4 PCB or the like. In the claims, the term "pin" means any electrically conductive structure which provides mechanical support for the flex dot so that it may be compressed and which provides an electrically conductive path through the hole in the substrate in which the pin is resident.

In the claims, the clause "means for providing an insulating mechanical support having one or more holes formed therein" means any combination of one or more insulating substrates such as polyimide or other types of film, printed circuit boards, molded insulating planes or any combination of the above which provides a foundation in which a plurality of holes may be formed such as drilling or molding, and structural equivalents with structural equivalents being defined as structures which perform the same function(s). The holes provide locations and support for the pins.

In the claims, the clause "first means for providing an insulating mechanical support having one or more holes formed therein" means any of the insulating substrate types or any combination of one or more insulating substrates disclosed herein which has holes in it which have pins therein, with pins being as defined herein and including metal plated through holes with conically plated sockets on each end, and structural equivalents with structural equivalents being defined as structures which perform the same function(s).

In the claims, the clause "second means for providing mechanical support and an electrically conductive path through each said hole" means any of the pin configurations or metal plated through hole configurations which provide mechanical support against which the flex dot material may be compressed and which provides an electrically conductive path between first and second sides of the insulating substrate, and structural equivalents with structural equivalents being defined as structures which perform the same function(s).

In the claims, the clause "third means associated with each pin for providing a flexible, electrically conductive path between said second means and a mating surface" means any of the different compositions for flex dot material recited herein and structural equivalents with structural equivalents being defined as structures which perform the same function(s).

As to a further discussion of the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed is:

1. A process for fabricating a connector comprising:
forming holes in an insulating substrate;
retaining conductive pins in each hole; and
placing electrically conductive flexible material in each hole in contact with said pins.

* * * * *